US005534756A

United States Patent [19]

Beeteson et al.

[11] Patent Number: 5,534,756

[45] Date of Patent: Jul. 9, 1996

[54] ELECTRIC FIELD EMISSION REDUCTION SYSTEM

[75] Inventors: John Beeteson, Skelmorlie; Andrew Knox, Kilbirnie, both of England

[73] Assignee: International Business Machines Corporation, Armonk, N.Y.

[21] Appl. No.: 408,511

[22] Filed: Mar. 22, 1995

[30] Foreign Application Priority Data

Sep. 15, 1994 [GB] United Kingdom .................. 9418570

[51] Int. Cl.[6] .................................................. H01J 29/56

[52] U.S. Cl. ............................................ 315/370; 315/8

[58] Field of Search ................................ 315/370, 8, 85; 361/150

[56] References Cited

U.S. PATENT DOCUMENTS

| | | | |
|---|---|---|---|
| 4,996,461 | 2/1991 | Bentley | 315/8 |
| 5,243,262 | 9/1993 | Moen | 315/370 |
| 5,396,151 | 3/1995 | Cappels, Sr. | 315/8 |
| 5,432,411 | 7/1995 | Beeteson et al. | 315/370 |

FOREIGN PATENT DOCUMENTS 2273230A 6/1994 United Kingdom .

*Primary Examiner*—Theodore M. Blum
*Attorney, Agent, or Firm*—David Aker

[57] ABSTRACT

An electric field cancellation system comprises a sensor (30) for generating an input signal (I) indicative of an unwanted electric field (E) radiating from a source (3), a variable gain amplifier (5) for amplifying the input signal (I) to produce an output signal (O), a radiator for generating a cancellation electric field (C) in anti-phase to the unwanted field (E) in response to the output signal (O) to at least partially cancel the unwanted field (E), feedback means (10) for generating an error signal (F) indicative of tile difference between the cancellation field (C) and the unwanted field (E), and control means (40) for varying the gain of the amplifier (4) to vary the output signal (O) in response to the error signal (F).

10 Claims, 4 Drawing Sheets

ELECTRIC FIELD EMISSION REDUCTION SYSTEM

FIELD OF THE INVENTION

The present invention relates to a system for reducing electric field emissions by the application of cancellation fields.

BACKGROUND OF THE INVENTION

A conventional raster scanned cathode ray tube (CRT) display such as a television receiver or a computer visual display unit comprises circuitry that can generate electric fields of sufficient strength to radiate beyond the display. Various studies have raised public concern about these electric fields and the possible health hazards associated with them. As a result of these concerns, various standards have been introduced defining maximum emission levels which products claiming to meet these standards can emit. In Northern Europe, for example, products can be tested to a standard developed and administered by TCO, the Swedish Confederation of Professional Employees. To meet a part of this standard, true RMS values of emissions in the frequency band from 2 kHz to 400 kHz are measured and must be less than 1 Volt/meter.

A CRT display typically comprises horizontal and vertical electromagnetic deflection coils arranged on a yoke mounted around the neck of the CRT. In operation, currents having a sawtooth waveform flow through the coils to scan the electron beam or beams across the CRT screen in a raster pattern. The voltages across the deflection coils reach a peak during the retrace or flyback period of the sawtooth currents. The peak voltage signals have a large component of harmonics of the corresponding deflection frequencies.

The electron beam or beams are accelerated from the neck of the CRT towards the screen by a "final anode" or Extra High Tension (EHT) voltage of typically 25 kV for a colour display. The flow of electrons is referred to as "beam current". The EHT voltage is typically generated from a step up transformer synchronised to the line scan. In displays having integrated horizontal deflection circuits and EHT generation, the voltage pulse signal driving the primary of the transformer is derived from the peak voltage across the horizontal deflection coil. In displays having separate EHT generation and horizontal deflection circuits, the voltage pulse signal is generated separately from the line scan signal, but maybe synchronised to it, although not necessarily in phase.

The output impedance of the EHT generator is sufficiently high that changes in beam current leading through screen content cause modulation of the EHT voltage. This is the primary source of radiated electric fields in front of the display. This modulation of the internal CRT final anode voltage is coupled through the CRT faceplate and transmitted through the intervening medium (air in this case) to the observation point.

Electric field emissions from CRT displays can be reduced at the sides and back by enclosing the radiating i conductors with grounded metal screens, and this is normal for multi-frequency displays. The screening necessary to reduce the emissions in front of the display is usually in the form of a conductive optical panel which is transparent to the light emitted by the CRT panel. The screen image is viewed through the panel which can diminish image quality. In addition, these panels are expensive to manufacture.

U.S. Pat. 5,151,635 describes an apparatus and method of reducing these time varying electric fields by providing a cancellation field of equal magnitude but opposite polarity to those generated by the horizontal deflection circuit, degaussing circuit and other circuits are provided, along with radiating antennae for each of these cancellation fields.

European Patent Application 0 523 741 describes a similar apparatus which senses the electric field associated with the deflection yoke and provides a signal to a radiating antennae.

For displays having integrated EHT generation and horizontal deflection circuits, the electric field sensed from the deflection circuit is similar to the actual electric field emitted from the display and so some cancellation of the primary source of radiated electric fields in front of the display is achieved. However, for displays having separate EHT generation and horizontal deflection circuits, such a system may not achieve cancellation of the field since although the two circuits are usually, but not always, synchronised, they may be distanced from each other in phase.

Prior art methods of using cancellation fields to reduce electric field emissions have used either combined EHT generation and horizontal deflection circuits or separate circuits, but with the circuits in please as well as synchronised. For these monitors the use of a signal from the horizontal deflection circuit to control the cancellation field provided some reduction in field emissions, but the fact that the primary source of radiated electric fields from the front of the display was the modulation of the internal CRT final anode voltage was not apparent due to the in-phase synchronous nature of the two circuits.

It is advantageous to sense this modulation directly and to provide cancellation based on this modulation rather than based on the horizontal deflection circuit. Even though the prior art method of sensing the field generated by the horizontal deflection in an integrated horizontal deflection and EHT generation circuit will provide some cancellation, improved cancellation can be achieved by sensing the modulation of the CRT anode directly. It is necessary to achieve emission levels of under 1 V/m in order to meet the TCO standard. It is unlikely that such levels can be achieved without eliminating modulations of the CRT final anode voltage.

Co-pending UK Patent Application No. 9312297.6 describes an open loop active field cancellation system for a CRT display. The system comprises a detection antenna connected via a matching network to the input of an inverting amplifier. The output of the amplifier is connected via a tuning network to a radiating antenna. In operation, the detection antenna detects electric fields radiating from the CRT. The amplifier amplifies and inverts the signal from the detection antenna. The matching network conditions the output from the detection antenna to correct for the amplifier gain and phase characteristics in preparation for application of the inverted signal output from the amplifier to the radiating antenna. A problem with this system is that it requires difficult adjustment during manufacture. Furthermore, in the event of a display fitted with this system requiring a major field service, readjustment may be needed. In addition, the open loop topology of this system limits further reductions in electric field radiation. This is a particularly significant problem because the acceptable Electric field emission level may be reduced as research continues. Still furthermore, high precision components are needed to prevent performance degradation with ageing.

SUMMARY OF THE INVENTION

In accordance with the present invention, there is now provided an electric field cancellation system comprising a sensor for generating an input signal indicative of an unwanted electric field radiating from a source, a variable gain amplifier for amplifying the input signal to produce an output signal, a radiator for generating a cancellation electric field in anti-phase to the unwanted field in response to the output signal to at least partially cancel the unwanted field, feedback means for generating an error signal indicative of the difference between the cancellation field and the unwanted field, and control means for varying the gain of the amplifier to vary the output signal in response to the error signal.

Because the output signal is generated as a function of both the electric field to be reduced and the cancelling electric field, the system of the present invention provides negative feedback, closed loop cancellation. The larger the error signal fed back, the larger the cancelling field generated. The cancelling field therefore tracks the unwanted field as the negative feedback loop tends to minimise the error signal. The variable gain control of the amplifier causes the amplifier to respond to unwanted electric field of very low magnitude. Therefore, difficult manual of the performance of the cancellation system during manufacture or field service is not required.

Preferably, the control means comprises an antenna for generating the error signal on simultaneous detection of both the cancellation field and the unwanted field.

In preferred embodiments of the present invention, the control means comprises an RMS to DC convertor for converting the error signal into a DC control level for controlling the gain of the amplifier.

The RMS to DC convertor advantageously generates a DC control level indicative of the total energy in any residual field remaining due to any difference between the cancellation field and the unwanted field.

The sensor may conveniently comprise a sense coil for inductively coupling the input of the amplifier to the source.

Alternatively, the sensor may comprise a capacitive sense element for capacitively coupling the input of the amplifier to the source.

The cancellation system of the present invention is especially useful for cancelling electric fields from a cathode ray display tube. The radiator may then conveniently comprise the electrically conductive "aquadag" coating on the exterior of the cathode ray tube. Alternatively, the radiator may comprise a conductive element at least partially surrounding the screen of the cathode ray tube. As a further option, the radiator may conveniently comprise an at least partially electrically conductive coating on the screen of the cathode ray tube.

Viewing the present invention for another aspect, there is now provided a method for at least partially cancelling an unwanted electric field radiating from a source, the method comprising: sensing the unwanted field; generating an input signal indicative of the unwanted field; amplifying, using a variable gain amplifier, the input signal to produce an output signal; generating a cancellation electric field in anti-phase to the unwanted field in response to the output signal to at least partially cancel the unwanted field: generating an error signal indicative of the difference between the cancellation field and the unwanted field: and, varying the gain of the amplifier to vary the output signal in response to the error signal.

BRIEF DESCRIPTION OF THE DRAWINGS

Preferred embodiments of the present invention will now be described with reference to the accompanying drawings in which.

DETAILED DESCRIPTION OF THE PREFERRED EMBODIMENTS

Figure 1:
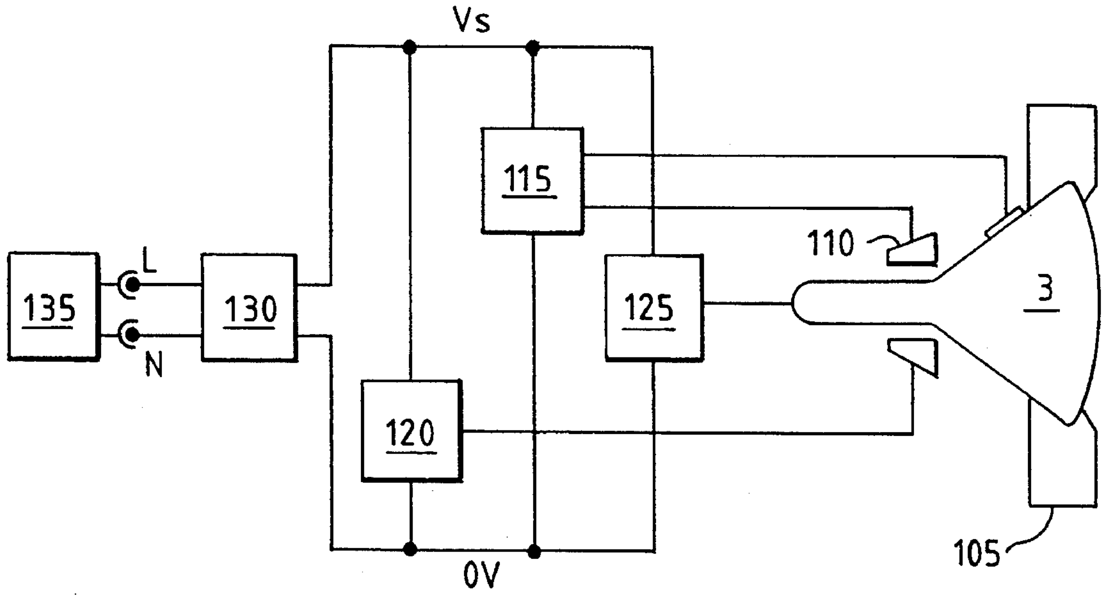
FIG. 1 is a block diagram of a CRT display.

Referring first to FIG. 1., a typical CRT display comprises a CRT 3 supported by a bezel 105. Horizontal and vertical deflection coils are disposed around the neck of the CRT 3 in a yoke 110. In use, the CRT is controlled by a drive circuit. The drive circuit comprises horizontal and vertical scan circuits 115 and 120 connected to the horizontal and vertical deflection coils respectively, a video amplifier 125 connected to the electron gun of the CRT 3, and a power supply 130 for supplying power from the mains at 135 to scan circuits 115 and 120 ad video amplifier 125 via supply rails Vs and OV. Horizontal deflection circuit 115 comprises an integral EHT generator connected to the final anode of CRT 3. In other examples, the EHT generator may be separate from the horizontal deflection circuit, but synchronised to the horizontal scan signal. The EHT generator comprises a step up transformer, the output of which is then rectified by high voltage diodes to produce, in conjunction with the CRT capacitance a DC output. A high resistance path to discharge the CRT capacitance (a bleed assembly) is present across the CRT 3. Not shown in this diagram is a degauss coil for demagnetising the CRT shadow mask. This coil operates generally whenever power is applied to the display. Thermistors, whose resistance depends on temperature are used to cause the resultant current through the degauss coil to decay rapidly from a peak to switch on to a lower value. This lower value should have no visible effect on the screen, but nevertheless there is a residual mains frequency field emitted.

In operation, power supply 130 receives power from the mains at 135. Line and frame scan circuits 115 and 120 generate line and frame sawtooth currents in the horizontal and vertical deflection coils to scan the three electron beams across CRT 3 in a raster pattern. Video amplifier 125 modulates the electron beam intensities with picture information in response to externally supplied red, green, and blue video signals. The sawtooth scan currents are synchronised to the input picture information by externally supplied horizontal and vertical synchronisation signals, The EHT transformer and CRT capacitance nominally cooperate to provide a constant DC voltage within the CRT.

When electron beam current flows in response to a video image, energy is drawn from the capacitance, causing a modulation of the DC voltage. This modulation signal is coupled through the CRT faceplate and transmitted, in the form of au undesirable time-varying electric field emission, through the intervening medium (air in most cases) to the observation point.

Figure 2:
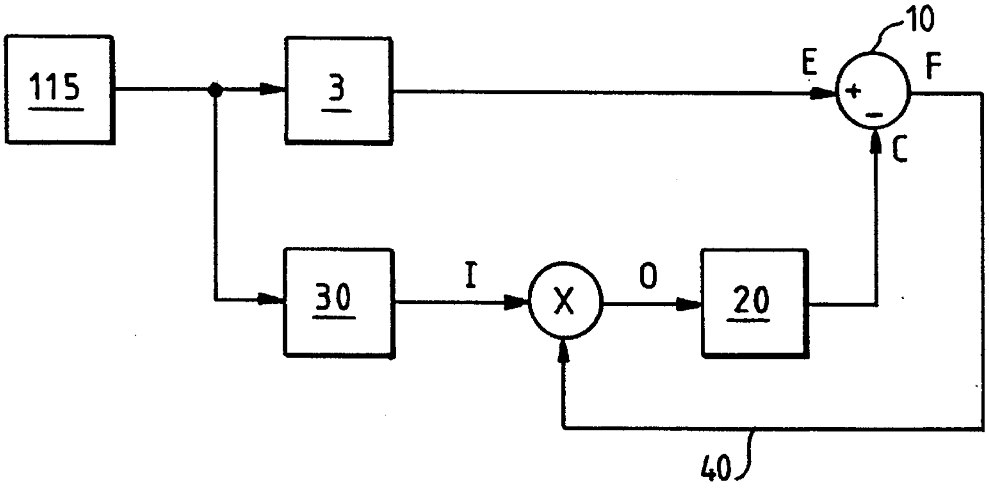
FIG. 2 is a general block diagram of a closed loop electric field cancellation system of the present invention.

Referring now to FIG. 2, an electric field cancellation of the present invention comprises a sensor 30 for generating an input signal I indicative of an unwanted electric field radiating from an electric field source such as CRT 3. A variable gain amplifier 5 is connected to sensor 30 for amplifying input signal. I from sensor 30 to produce an output signal 0. A radiator 20 is connected to amplifier 5 for generating a cancellation electric field C in anti-phase to unwanted field E in response to output signal 0 from amplifier 5 to at least partially cancel unwanted field E. Feedback means 10 generates an error signal F indicative of the difference between cancellation field C and unwanted field E. Control means 40 is connected to feedback means 10 for varying the gain of amplifier 5 to vary output signal 0 in response to the error signal F.

Figure 3:
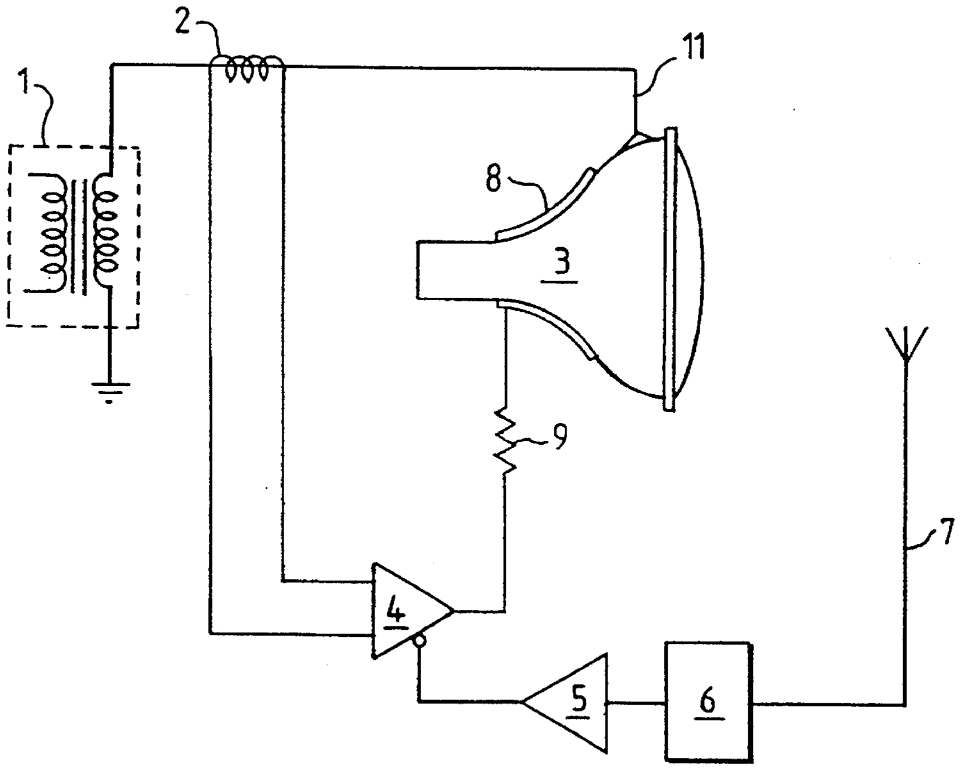
FIG. 3 is a block diagram of an embodiment of the cancellation system of the present invention.

Referring now to FIG. 3, in a preferred embodiment of an electric field cancellation system of the present invention, sensor 30 is in the form of a sense coil 2 around a coupling cable 11 connecting the secondary winding of the EHT transformer 1 to CRT 3. Coil 2 is connected to the input of variable gain inverting amplifier 4. Radiator 20 is in the form of an aquadag conductive coating 8 on the exterior of CRT 3. Control means 40 includes an RMS to DC convertor 5 and a signal conditioning circuit 6. Amplifier 4 has a variable gain input connected to the output of convertor 5. Feedback means 10 includes a high impedance antenna 7. The input to convertor 5 is connected, through signal conditioning circuit 6 to antenna 7.

In operation, sensor 2 detects the modulation signal from the current flowing in coupling cable 11. In the example of FIG. 2, a replica of the modulation signal is induced by transformer action at the input of amplifier 4 via sense coil 2. Amplifier 4 forms part of the forward path of the closed loop cancellation apparatus. In the forward path, amplifier 4 amplifies and inverts the sensed modulation signal to produce at its output a cancellation signal which is in anti-phase with the actual modulation signal. The cancellation signal is applied to aqua dag coating 8 via resistor 9. Coating 8 acts as a radiator, responding to application of the cancellation signal by radiating a correspondingly time-variant electric cancellation field. The cancellation field propagates through the display and destructively interferes with the unwanted field produced by the actual modulation signal. It will be appreciated that, in the event of a flashover, damage may be sustained by the FIG. 2 circuit topology and, in particular, by amplifier 4. Therefore, in a preferred modification, zener diodes, spark gaps or other devices with similar functions may be incorporated to provide a low impedance return path to ground for flashover current.

Any difference in amplitude between the phase and antiphase electric fields produces a residual field. Antenna 7 detects both the phase and antiphase signals to generate a feedback voltage signal. The feedback signal is the vector sum of the phase and antiphase fields and is thus a measure of any residual field. Signal conditioning circuit 6 provides impedance matching of the input of convertor 5 to the output of antenna 7. In response to the feedback signal, convertor 5 generates at the variable gain input of amplifier 4 a DC control voltage level which is representative of the energy in the residual field. Changes in the control level produce corresponding changes in the gain of amplifier 4 thereby varying the cancellation field strength in sympathy with variations in the residual field. A negative feedback loop is thus provided, tending to minimise the residual field.

In the conventional open loop systems, a potentiometer is typically provided to permit manual optimisation of active electric field cancellation. Advantageously, no potentiometer adjustment required to optimise the performance of the closed loop system of the present invention because the feedback loop minimises unwanted field emission automatically.

It will be appreciated that to obtain residual fields of the order of 1 V/m from conventional open loop systems, extreme care must be taken with potentiometer adjustment and circuit design. Advantageously, the closed loop system of tulle present invention may automatically reduce the residual field to significantly less than 1 V/m. The negative feedback loop of the closed loop system of the present invention effectively provides fine gain control of amplifier 4, avoiding a requirement for time consuming and difficult manual adjustment.

Figure 7:
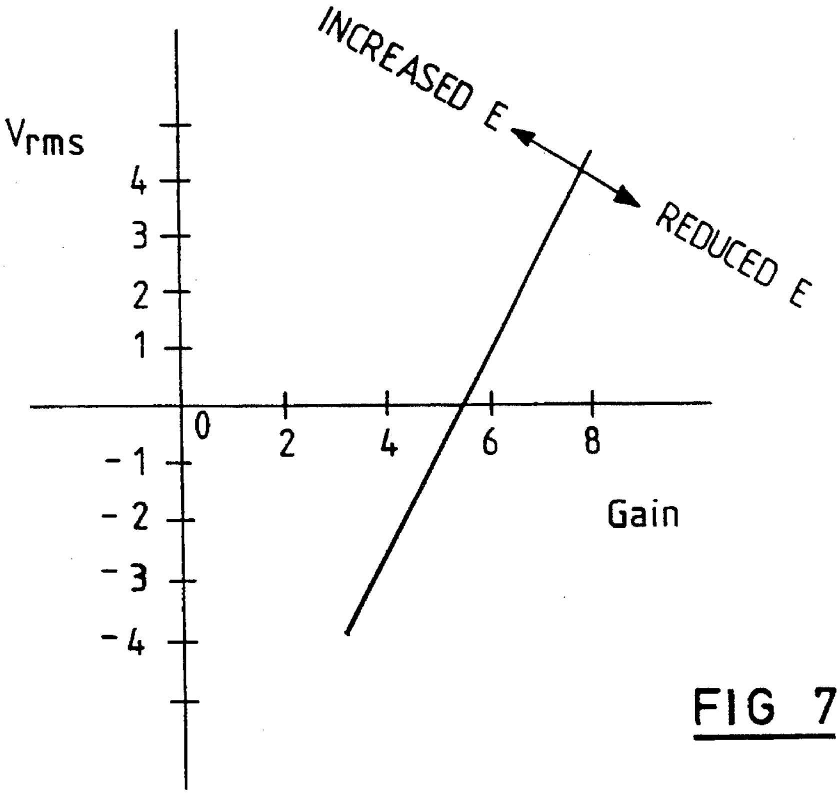
FIG. 7 is a transfer function relating to a cancellation system of the present invention.

As mentioned previously, the feedback signal produced by antenna 7 is a function of the vector sum of the phase and antiphase electric fields. The feedback signal is converted to a DC control level by convertor 5. The DC control level tunes the Gain of amplifier 4. Referring now to FIG. 7, the transfer function of amplifier 4 is such that a nominally gain of five is available when tile DC control level, $V_{rms}$, is zero.

Figure 8:
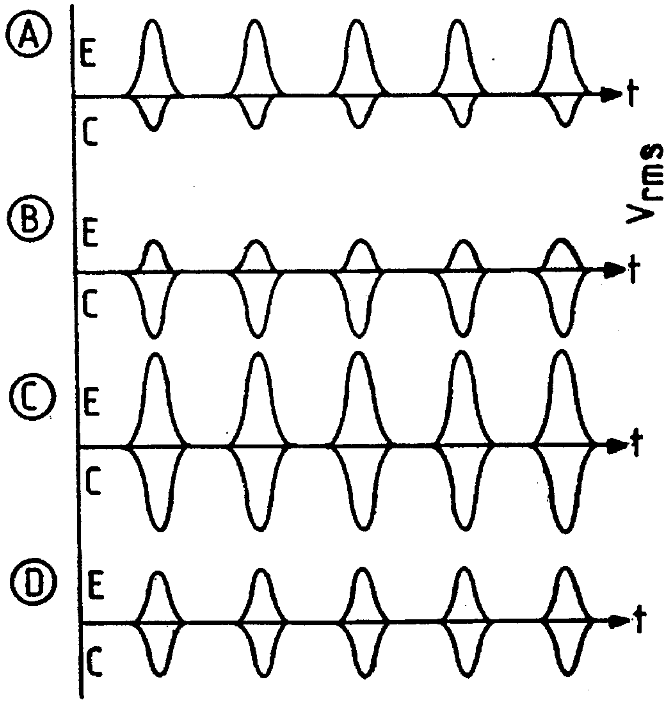
FIGS. 8A to D are waveform diagrams relating to a cancellation system of the present invention.
Figure 9:
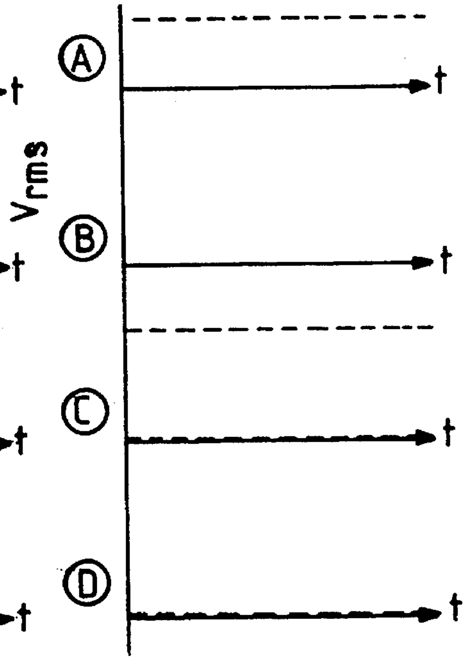
FIGS. 9A to D are voltage level diagrams relating to a cancellation system of the present invention.

FIG. 8A illustrates typical waveforms of the phase E and antiphase C fields where the phase field strength E is greater than the antiphase field strength C. Referring to FIG. 9A, the corresponding control level, $V_{rms}$, is positive. The gain of amplifier 4 is thus increased, thereby increasing the antiphase field C, and leading to an overall reduction of the residual field.

FIG. 8B illustrates typical waveforms of the phase E and antiphase C fields where the phase field strength E is less than the antiphase field strength C. Referring to FIG. 9B, the corresponding control level, $V_{rms}$, is negative. The gain of amplifier 4 is thus reduced, thereby decreasing the antiphase field C, and leading to an overall reduction of the residual field.

FIGS. 8C and 8D illustrate the typical waveforms of the phase E and antiphase C fields where the phase field strength E equals the antiphase field strength C. Referring to FIG. 9C and 9D, the corresponding control level, $V_{rms}$, is zero. The gain of amplifier 4 is thus kept at the nominal level, maintaining the residual field at a constant minimum.

Referring back to FIG. 7, the gradient of the curve indicative of the transfer function will determines the residual gain error of the feedback loop. Therefore, the curve is preferably very close to zero, lying at a slight angle relative to the X axis, so that minute residual fields detected by antenna 7 produce significant modification of the gain of amplifier 4. The time constant of the feedback loop is set to several frame periods of the display to give stability. It will be appreciated that the closed loop cancellation system of the present invention may be used to enhance a conventional open loop cancellation system by overcoming the aforementioned problem of manual tuning of the open loop performance and to allow only very low residual fields, if any, to radiate from the display.

Figure 4:
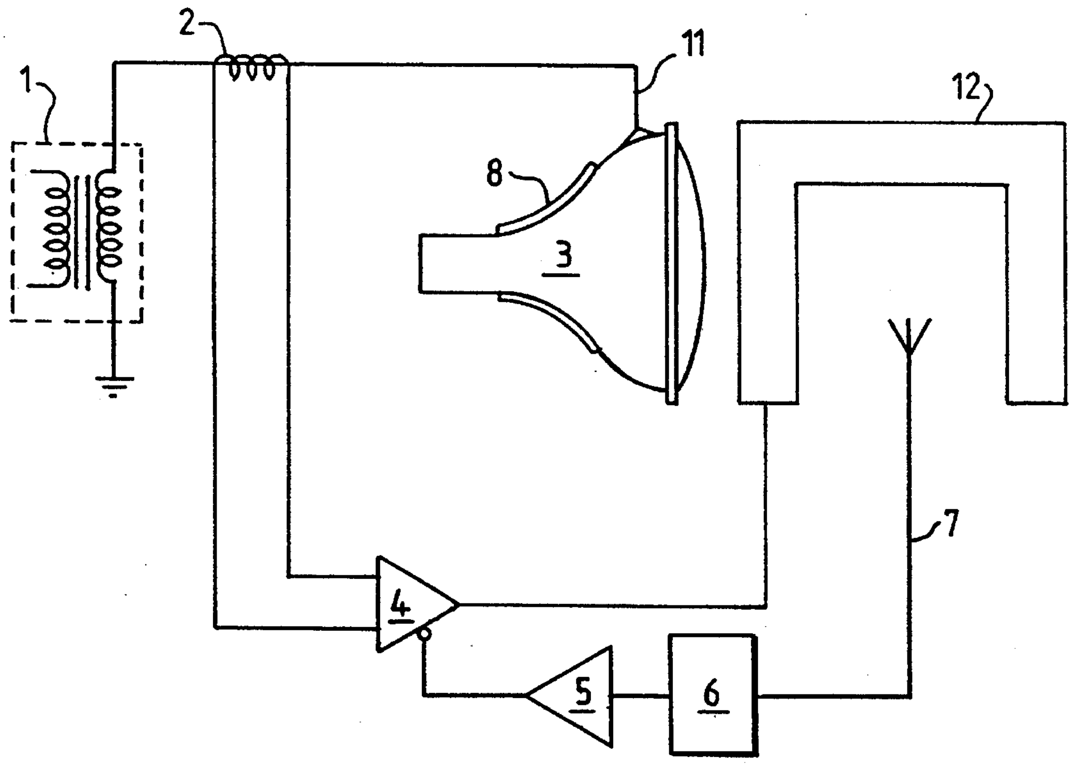
FIG. 4 is a block diagram of another embodiment of the cancellation system of the present invention.

Referring now to FIG. 4, in another modification of the embodiment of the present invention hereinbefore described, radiator 20 is in the form of an electrically conductive element 12 instead of the aquadag coating 8 of CRT 3.

Figure 5:
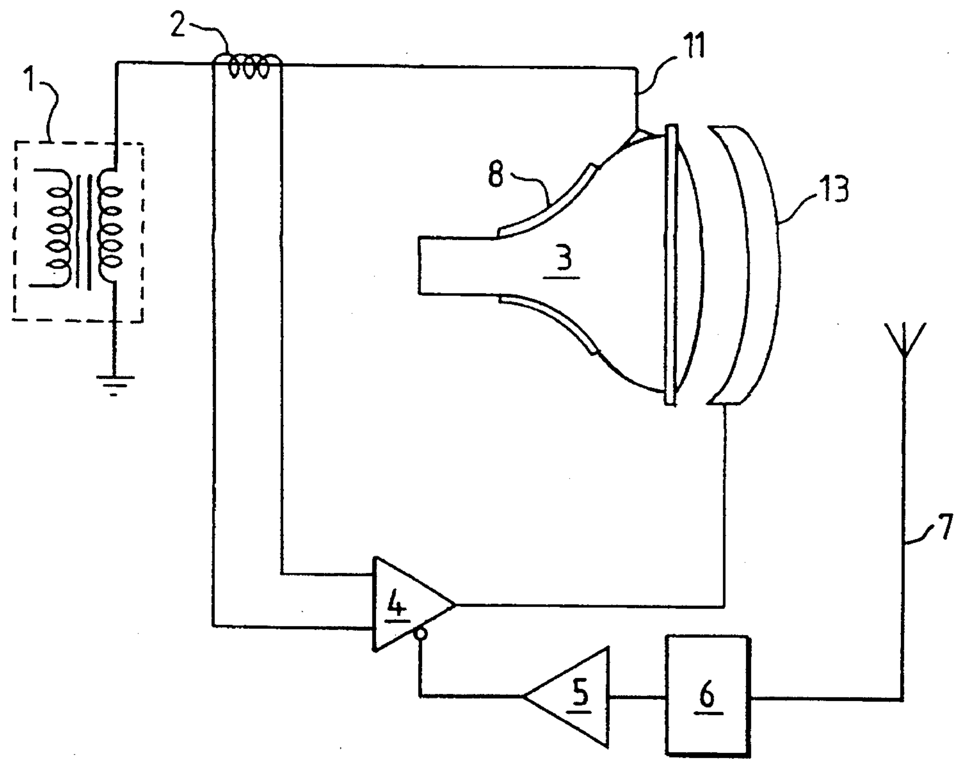
FIG. 5 is a block diagram of yet another embodiment of the cancellation system of the present invention.

Referring now to FIG. 5, in yet another modification of the preferred embodiment of the present invention hereinbefore described, radiator 20 is provided by a high resistance "ESF" coating 13 on CRT 3.

Figure 6:
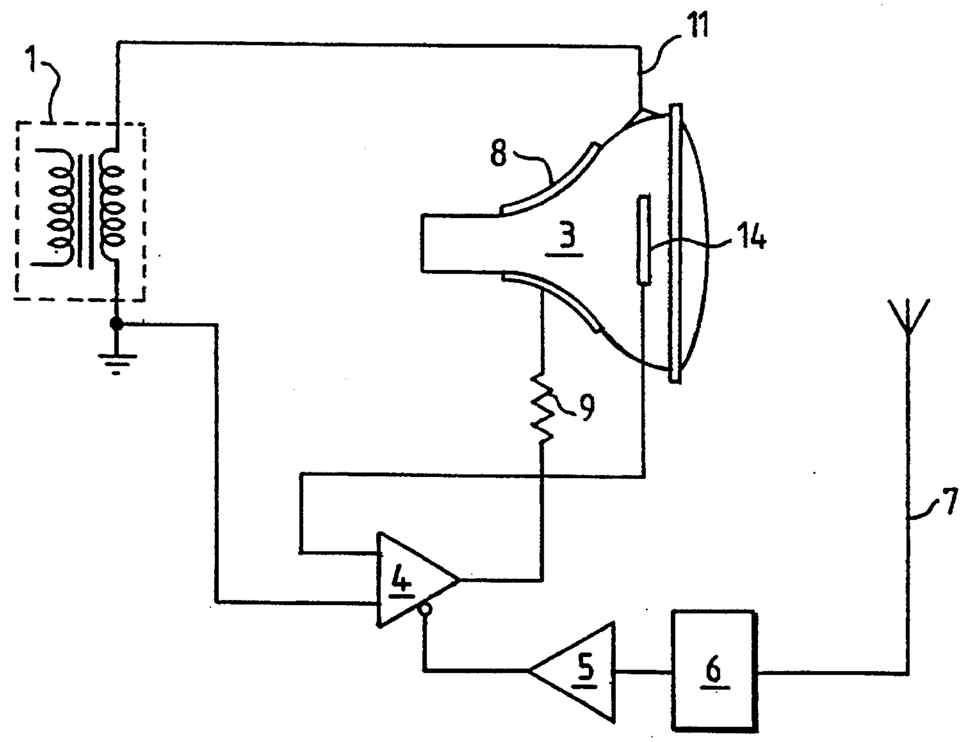
FIG. 6 is a block diagram of still another embodiment of the cancellation system of the present invention.

Referring now to FIG. 6, in a further modification of the preferred embodiment of the present invention hereinbefore described, instead of sense coil 2, sensor 30 is in the form of an electrically conductive sensing element 14 attached to a non-shielded portion of CRT 3. In operation the modulation signal is induced in the sense element by capacitive coupling.

In the examples of the present invention hereinbefore described, the circuit topology is effectively a first order servo system. This is unconditionally stable. Thus, it is not necessary to have a highly accurate RMS to DC convertor with good linearity. A simple, cost effective circuit will suffice.

Preferred embodiments of the present invention have been hereinbefore described with reference to a colour CRT display device,. However, it will be appreciated that the present invention is equally applicable to monochrome CRT displays. Furthermore, it will also be appreciated that the present invention is not limited in application to CRT display technologies. Rather more, it will be appreciated that the present invention is equally applicable to other technologies, such as fluorescent lighting systems and other high voltage electrical appliances.

What is claimed is:

1. An electric field cancellation system comprising a sensor (30) for generating an input signal (I) indicative of an unwanted electric field (E) radiating from a source (3), a variable gain amplifier (5) for amplifying the input signal (I) to produce an output signal (O), a radiator (20) for generating a cancellation electric field (C) in antiphase to the unwanted field in response to the output signal to at least partially cancel the unwanted field, feedback means (10) for generating an error signal (F) indicative of the difference between the cancellation field and the unwanted field, and control means (40) for varying the gain of the amplifier to vary the output signal in response to the error signal.

2. A system as claimed in claim 1, wherein the feedback means (10) comprises an antenna (7) for generating the error signal on simultaneous detection of both the cancellation field and the unwanted field.

3. A system as claimed in claim 2, wherein the control means (40) comprises an RMS to DC convertor (7) for converting the error signal into a DC control level for controlling the gain of the amplifier.

4. A system as claimed in claim 1, wherein the sensor (30) comprises a sense coil (2) for inductively coupling the input of the amplifier to the source.

5. A system as claimed in claim 1, wherein the sensor (30) comprises a capacitive sense element (14) for capacitively coupling the input of the amplifier to the source.

6. Display apparatus comprising a cathode ray display tube and an electric field cancellation system as claimed in claim 1, wherein the source (3) comprises the cathode ray display tube (3).

7. Display apparatus as claimed in claim 6, wherein the radiator (20) comprises a electrically conductive coating (8) on the exterior of the cathode ray tube (3).

8. Display apparatus as claimed in claim 6, wherein the radiator (20) comprises a conductive element (12) at least partially sorrounding the screen of the cathode ray tube (3).

9. Display apparatus as claimed in claim 6, wherein the radiator (20) comprises an at least partially electrical conductive coating on the screen of the cathode ray tube (3).

10. A method for at least partially cancelling an unwanted electric field radiating from a source, the method comprising:

sensing the unwanted field;

generating an input signal indicative of the unwanted field;

amplifying, using a variable gain amplifier, the input signal to produce an output signal;

generating a cancellation electric field in anti-phase to the unwanted field in response to the output signal to at least partially cancel the unwanted field;

generating an error signal indicative of the difference between the cancellation field and the unwanted field; and, varying the gain of the amplifier to vary the output signal in response to the error signal.

* * * * *